(12) United States Patent
Sullivan et al.

(10) Patent No.: US 9,044,832 B2
(45) Date of Patent: Jun. 2, 2015

(54) INFRARED SCANNING PORT

(71) Applicant: Thomas & Betts International, Inc., Wilmington, DE (US)

(72) Inventors: Brian Raleigh Sullivan, Midlothian, VA (US); Michael David VanStavern, Richmond, VA (US); Kristofor Lynn Redinger, Mechanicsville, VA (US); Christopher William Hackman, Henrico, VA (US); Richard F. Riczinger, Hanover, VA (US)

(73) Assignee: THOMAS & BETTS INTERNATIONAL, LLC, Wilmington, DE (US)

(*) Notice: Subject to any disclaimer, the term of this patent is extended or adjusted under 35 U.S.C. 154(b) by 287 days.

(21) Appl. No.: 13/673,621

(22) Filed: Nov. 9, 2012

(65) Prior Publication Data

US 2013/0117995 A1    May 16, 2013

Related U.S. Application Data

(60) Provisional application No. 61/558,705, filed on Nov. 11, 2011.

(51) Int. Cl.
| | |
|---|---|
| *B23P 11/00* | (2006.01) |
| *F16B 17/00* | (2006.01) |
| *F16B 33/00* | (2006.01) |
| *H05K 5/02* | (2006.01) |

(52) U.S. Cl.
CPC .............. *B23P 11/00* (2013.01); *F16B 17/00* (2013.01); *F16B 33/00* (2013.01); *H05K 5/0239* (2013.01)

(58) Field of Classification Search
CPC ..... B23P 11/00; B32B 17/10018; F16B 17/00; F16B 33/00; G01J 5/04; G01J 5/0859; G01J 5/0875; G02B 5/208; G02B 7/22; G02B 7/24; H02B 13/045

See application file for complete search history.

(56) References Cited

U.S. PATENT DOCUMENTS

| | | | |
|---|---|---|---|
| 1,547,142 A | 2/1923 | Bausch | |
| 4,708,419 A | 11/1987 | Scherber et al. | |
| 5,039,203 A | 8/1991 | Nishikawa | |
| 5,481,400 A | 1/1996 | Borden | |
| 5,493,126 A | 2/1996 | Taylor et al. | |
| 5,776,612 A | 7/1998 | Fisher | |
| 5,793,522 A | 8/1998 | Brun | |
| 7,079,334 B2 | 7/2006 | Holliday et al. | |
| 7,286,309 B2 | 10/2007 | Holliday et al. | |
| 7,687,777 B2 | 3/2010 | Norell | |
| 8,599,329 B2 * | 12/2013 | Kang et al. | 349/58 |
| 2009/0135583 A1 * | 5/2009 | Hillman et al. | 362/97.1 |
| 2010/0014152 A1 | 1/2010 | Robinson | |
| 2010/0020389 A1 * | 1/2010 | Schmidt et al. | 359/350 |
| 2010/0103509 A1 * | 4/2010 | Robinson | 359/356 |
| 2011/0149191 A1 * | 6/2011 | Chen et al. | 349/58 |
| 2011/0267750 A1 * | 11/2011 | Hirota | 361/679.01 |
| 2013/0160373 A1 * | 6/2013 | Holliday | 49/386 |
| 2014/0102021 A1 * | 4/2014 | Gosling et al. | 52/234 |
| 2014/0294373 A1 * | 10/2014 | Chen et al. | 396/428 |

* cited by examiner

*Primary Examiner* — Alexander P Taousakis
(74) *Attorney, Agent, or Firm* — Butler Snow LLP

(57) ABSTRACT

We disclose a method for securing an infrared transmissive polymer to integrated panels, deadfronts, or transition plates, thus providing a reinforced polymer window through which the thermographer can scan an energized unit without being directly exposed to contact with internal components or having to remove said panels, deadfronts, or transition plates. We also disclose a device for securing the polymer consisting of a retention frame with half shear retainers that keep the polymer locked in place.

7 Claims, 5 Drawing Sheets

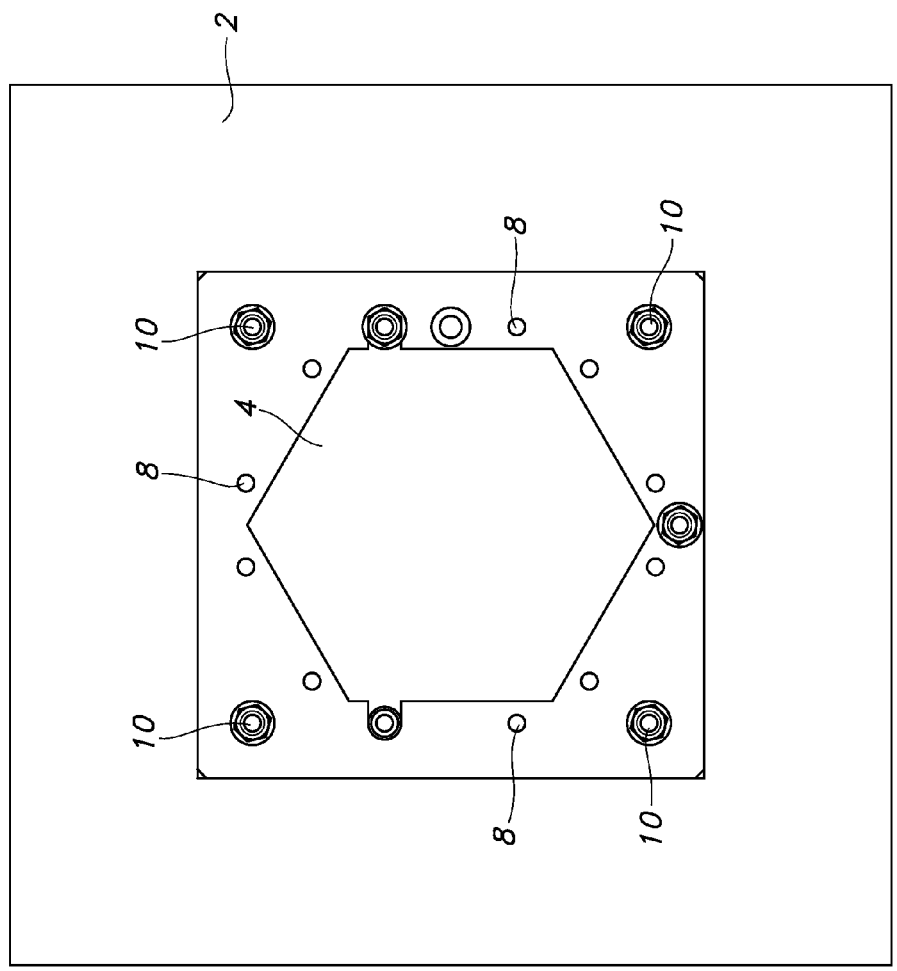

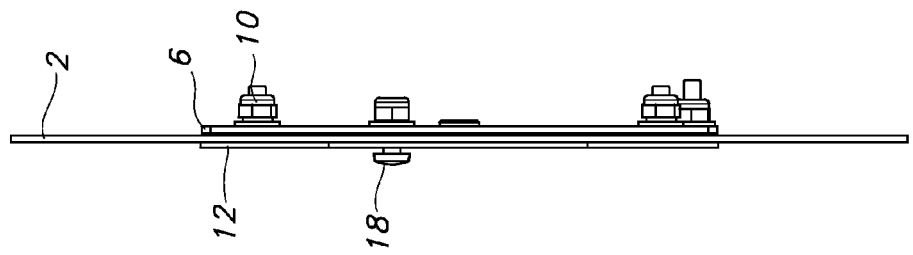
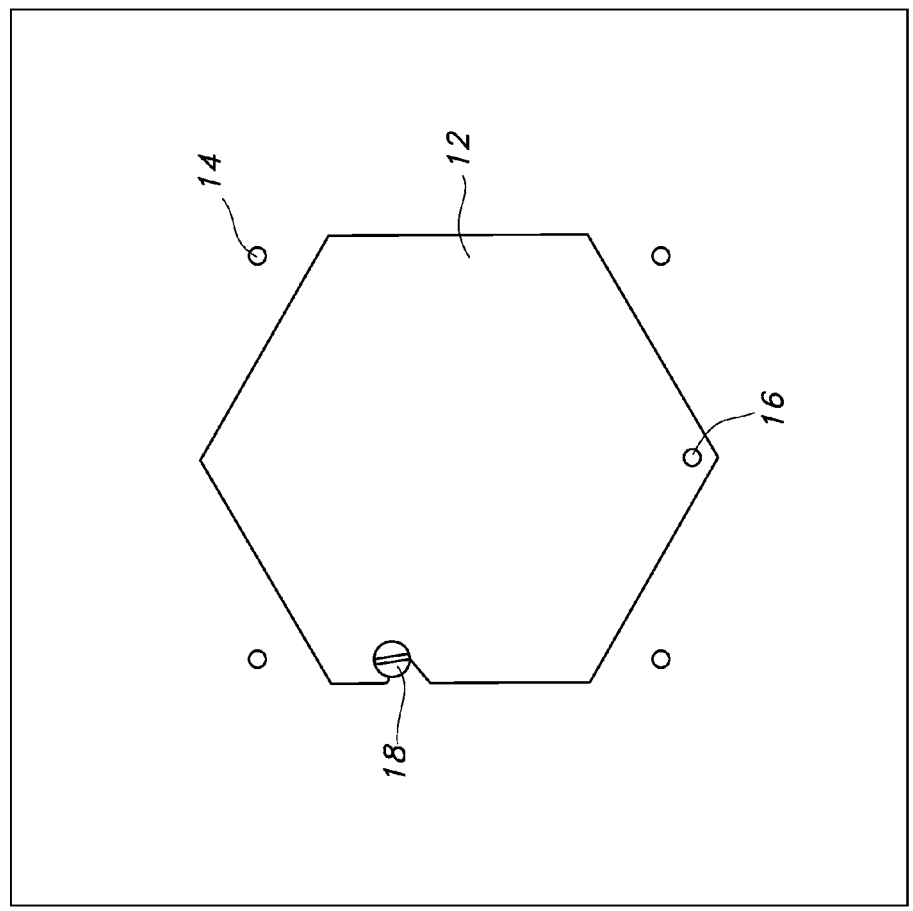
FIG. 4
FIG. 5

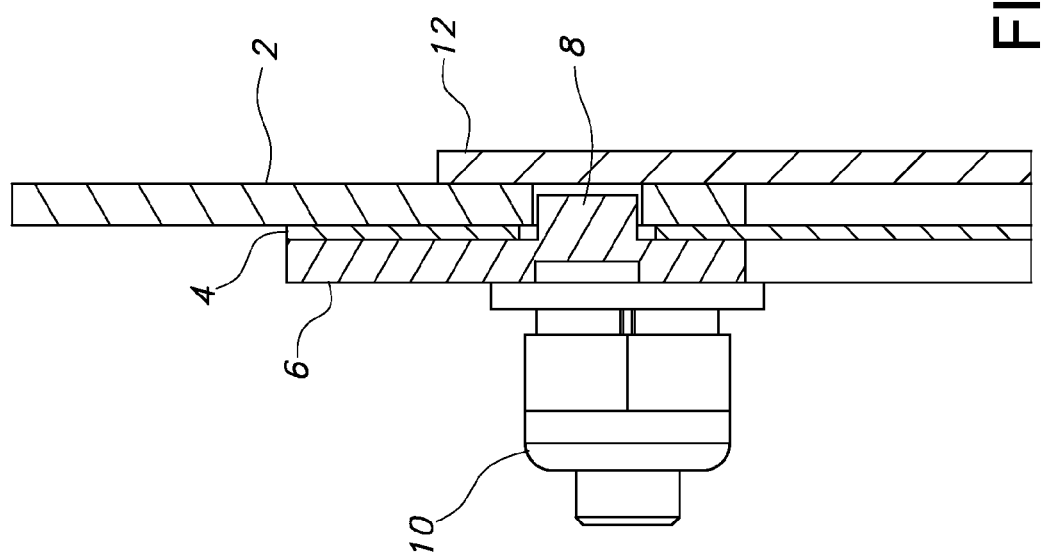

INFRARED SCANNING PORT

FIELD OF THE INVENTION

The present invention is generally directed toward a method and device for affixing an infrared transmissive polymer window to a panel of an electrical enclosure.

BACKGROUND OF THE INVENTION

Thermal infrared scans of switchgear and other electrical enclosures allow technicians to monitor and possibly identify faulty or failing components within the device. However, to get an accurate scan, the thermal imaging must be performed while the device is energized and, either with the enclosure panels removed to provide a clear view of the electrical components, or through a viewing window.

These windows are typically made of an extremely thin infrared transmissive polymer. However, this thin polymer window must be reinforced with hard material to give it structural integrity so that it does not break or become damaged due to heat or pressure from within the panel. This material is typically perforated with an array of holes such that it forms a protective grill. However, the protective grill adds a layer that may obscure the imaging infrared scanner's view of the electrical components and could interfere with the accuracy of the imaging process.

SUMMARY OF THE INVENTION

We disclose a method of securing an infrared transmissive polymer to integrated panels, deadfronts, or transition plates, thus providing a polymer window through which the thermographer can scan an energized unit without being directly exposed to harm.

BRIEF DESCRIPTION OF THE DRAWINGS

Further advantages of the invention will become apparent by reference to the detailed description of preferred embodiments when considered in conjunction with the drawings:

FIG. 2 depicts an elevation view of the infrared scanning port as viewed from inside the electrical panel.

FIG. 3 depicts a left side elevation view of the infrared scanning port.

FIG. 4 depicts an elevation view of the infrared scanning port as viewed from the front.

FIG. 5 depicts a right side elevation view of the infrared port.

FIG. 7 depicts a left side elevation view of the inset A of FIG. 3.

DETAILED DESCRIPTION

Figure 1:
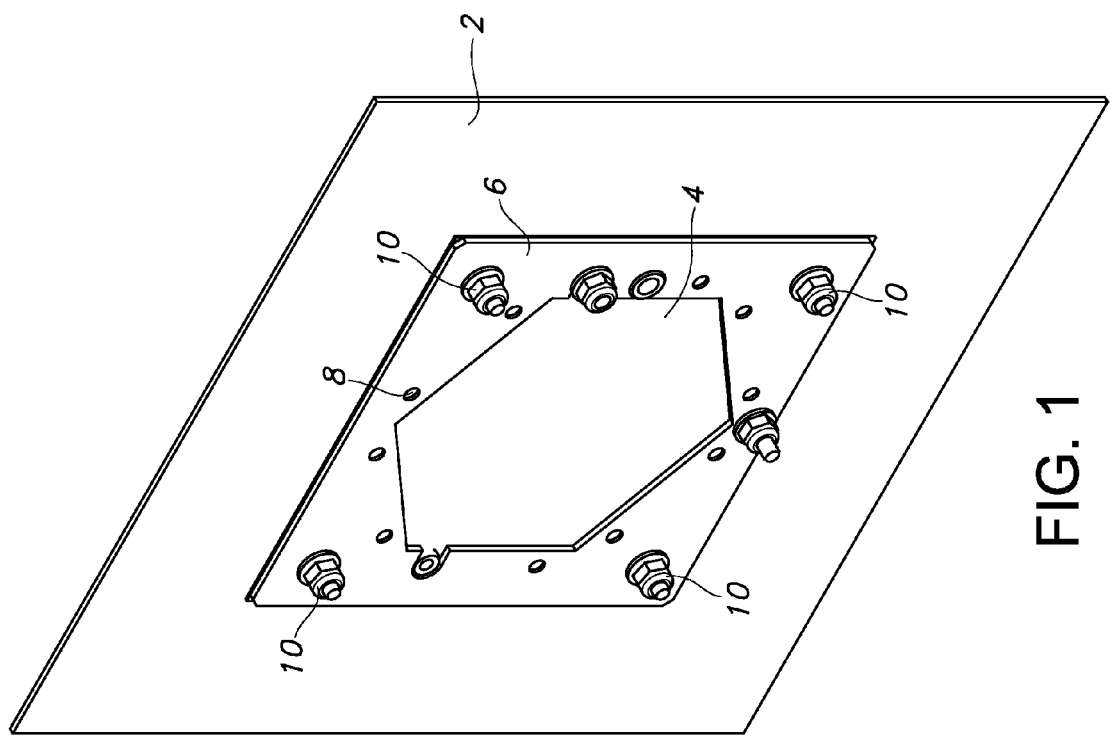
FIG. 1 depicts a perspective view of the infrared scanning port as viewed from inside the electrical panel.

The following detailed description is presented to enable any person skilled in the art to make and use the invention. For purposes of explanation, specific details are set forth to provide a thorough understanding of the present invention. However, it will be apparent to one skilled in the art that these specific details are not required to practice the invention. Descriptions of specific applications are provided only as representative examples. Various modifications to the preferred embodiments will be readily apparent to one skilled in the art, and the general principles defined herein may be applied to other embodiments and applications without departing from the scope of the invention. The present invention is not intended to be limited to the embodiments shown, but is to be accorded the widest possible scope consistent with the principles and features disclosed herein.

As will be appreciated from the figures, panel 2 is a unit enclosure panel that separates the electrical components within it from the environment, including integrated panels, deadfronts, or transition plates. Aperture 20 in panel 2 is an opening through which the infrared scanner has a line of sight view of the electrical components. Although the embodiment shown in the figures has an aperture 20 that is approximately hexagonal shape and about four inches wide between the vertices, aperture 20 may be any shape and size to allow an infrared camera to have an unobstructed view of the electrical components in the electrical panel.

Panel 2 also has a series of retention holes 14 surrounding the aperture 20. The retention holes 14 are configured to receive a portion of infrared transmissive polymer 4 and retention frame 6 as part of the half shear retention system that will keep the infrared transmissive polymer 4 in place. In a preferred embodiment, these retention holes 14 are located annually around aperture 20.

Figure 6:
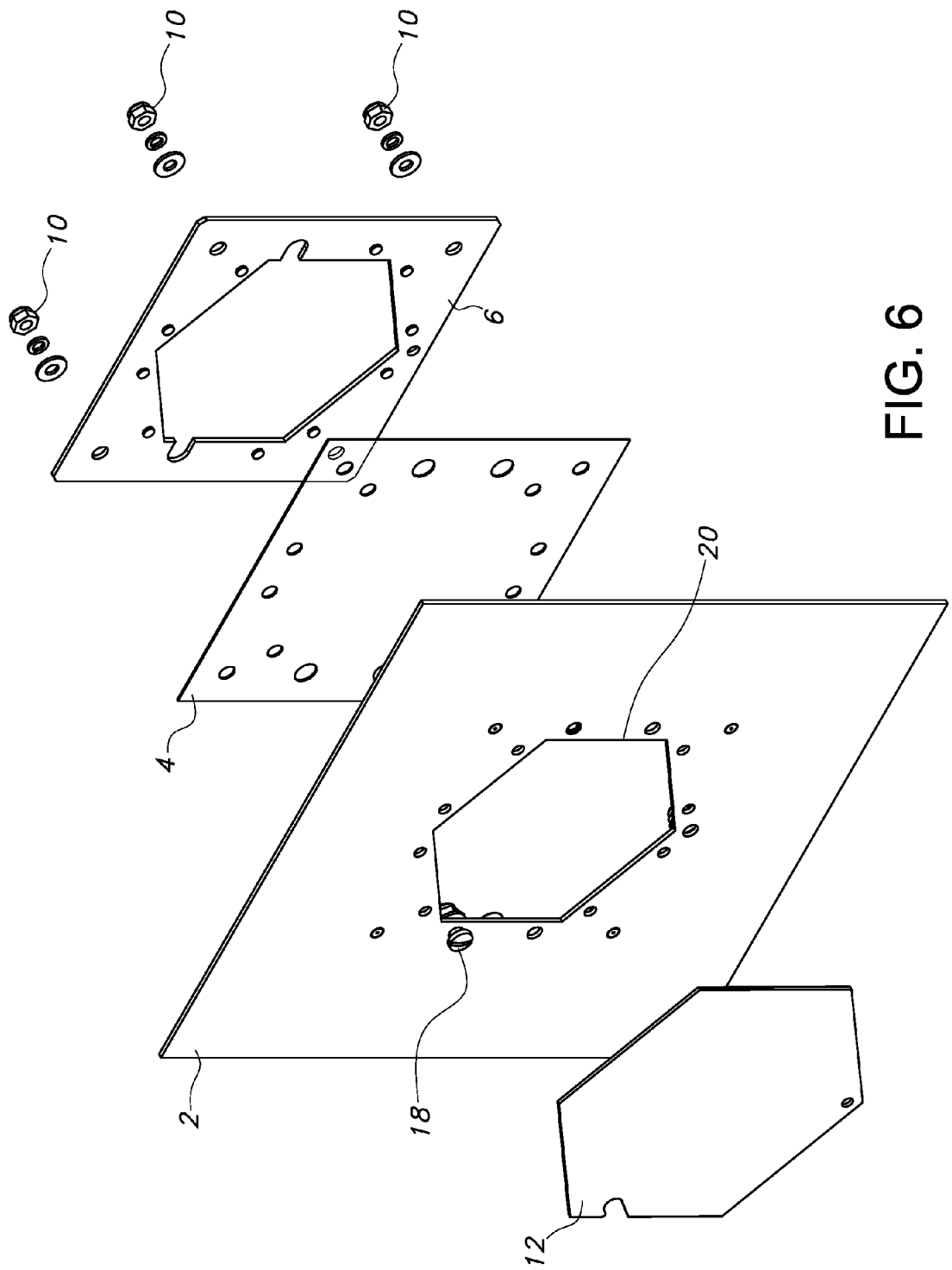
FIG. 6 depicts an exploded perspective view of the infrared port.

As will be appreciated from FIG. 6, the infrared transmissive polymer 4 will act as a window over the aperture 20. The infrared transmissive polymer 4 is a thin flexible sheet of polymer that allows the passage of infrared radiation through it. When positioned over aperture 20, the edges of the infrared transmissive polymer 4 extend beyond aperture 20 and overlap with panel 2.

A portion of infrared transmissive polymer 4 that overlaps with panel 2 is sandwiched between panel 2 and retention frame 6. Retention frame 6 is generally a flat piece of hard material, such as metal, having an opening in the interior that approximates the shape and size of aperture 20 and is referred to herein as frame opening 22. As can be seen from the FIG. 1, in one embodiment, the frame opening 22 is a symmetric, approximately hexagonal shape with cutouts to accommodate a captive retention bolt 18 (described below).

As can be seen from FIG. 7, retention frame 6 includes a series of half shear retainers 8 that surround frame opening 22. These half shear retainers 8 are dimple-like protrusions that extend from the plane of the retention frame 6. In a preferred embodiment, the half shear retainers 8 protrude beyond the plane to a distance of approximately half of the width of the retention frame 6. The half shear retainers 8 are positioned around the frame opening 22 such that each one lines up with a retention hole 14 in the panel 2 when they are placed against each other. The infrared transmissive polymer 4 also may include a series of holes, referred to as polymer holes 24, that are positioned in a corresponding pattern to the retention holes 14 in the retention frame 6. Each half shear retainer 8 is configured to pass through a corresponding polymer hole 24 and into a retention hole 14 in the panel 2 when the retention frame 6 and infrared transmissive polymer 4 are properly oriented and positioned together.

When properly oriented such that the half shear retainers 8 in the retention frame 6 each 14 line up with a corresponding polymer hole 24 and retention hole 14 in the panel 2, the retention frame 6 and infrared transmissive polymer 4 can be positioned against panel 2, effectively sandwiching the infrared transmissive polymer 4 between retention frame 6 and panel 2. The assembly can then be secured by the use of hardware such as the retaining nuts 10 and retaining bolt 26. Retaining bolt 26 can be passed through holes in panel 2, infrared transmissive polymer 4, and retention frame 6.

Retaining nut 10 can then be fastened onto the bolt, such that the retention frame 6 is secured against panel 2. It should be appreciated that retaining bolt 26 is short enough that it does not protrude very far into the electrical panel. This helps ensure that it does not come into contact with any energized electrical components.

With retention frame 6 securely fastened against panel 2, infrared transmissive polymer 4 is secured and is prevented from moving due to the series of half shear retainers 8 positioned around frame opening 22. The infrared transmissive polymer 4 would act as a window that infrared radiation can pass through while preventing contaminants from entering the electrical enclosure. The infrared transmissive polymer 4 would also prevent a user from inadvertently contacting electrical components housed within the electrical enclosure.

In a preferred embodiment, a cover 12 is provided that protects the transmissive infrared polymer 4 from being exposed to the environment, thus reducing the risk of it become damaged or dirty. As can be seen in FIG. 4, cover 12 is approximately the same shape and slightly larger than aperture 20, such that it completely obscures aperture 20 when it is in a closed position. Cover 12 can swing in front of the aperture 20 due to it being affixed to the panel 2 through pivot point 16. The cover 12 is configured such that it can hook against captive retention bolt 18 and remain in a closed position.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

The invention has been described with reference to various specific and preferred embodiments and techniques. However, it should be understood that many variations and modifications may be made while remaining within the spirit and scope of the invention. It will be apparent to one of ordinary skill in the art that methods, devices, device elements, materials, procedures and techniques other than those specifically described herein can be applied to the practice of the invention as broadly disclosed herein without resort to undue experimentation. All art-known functional equivalents of methods, devices, device elements, materials, procedures and techniques described herein are intended to be encompassed by this invention. Whenever a range is disclosed, all subranges and individual values are intended to be encompassed. This invention is not to be limited by the embodiments disclosed, including any shown in the drawings or exemplified in the specification, which are given by way of example and not of limitation.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

We claim:

1. A device for securing an infrared transmissive polymer to a panel comprising a retention frame, said retention frame surrounding a frame opening and having protrusions on the side of said retention frame that faces said panel, wherein said frame opening corresponds to an aperture in said panel and wherein said protrusions correspond to retention holes in said panel and polymer holes in said infrared transmissive polymer.

2. The device of claim 1 further comprising a cover configured to attach to said panel and conceal said infrared transmissive polymer.

3. The device of claim 2 wherein said cover is attached to said panel with a hinge.

4. The device of claim 1 wherein said protrusions are half shear retainers.

5. The device of claim 1 wherein said protrusions extend a distance of half the width of said retention frame.

6. The device of claim 1 wherein said retention frame has bolt holes for receiving a bolt for securing said retention frame to said panel.

7. The device of claim 6 wherein said infrared transmissive polymer includes bolt holes that correspond in position to said bolt holes of said retention frame.

* * * * *